(12) United States Patent
Chen

(10) Patent No.: US 10,517,187 B1
(45) Date of Patent: Dec. 24, 2019

(54) MODULAR RACK ASSEMBLY

(71) Applicant: CFW Investments LLC, Irvine, CA (US)

(72) Inventor: Li Chen, Shenzhen (CN)

(73) Assignee: CFW Investments LLC, Irvine, CA (US)

( * ) Notice: Subject to any disclaimer, the term of this patent is extended or adjusted under 35 U.S.C. 154(b) by 0 days.

(21) Appl. No.: 16/192,531

(22) Filed: Nov. 15, 2018

(51) Int. Cl.
| H05K 7/14 | (2006.01) |
| H01M 2/10 | (2006.01) |
| A47B 57/52 | (2006.01) |
| G06F 1/20 | (2006.01) |

(52) U.S. Cl.
CPC ........ H05K 7/1427 (2013.01); H01M 2/1016 (2013.01); H05K 7/1435 (2013.01); *A47B 57/52* (2013.01); *G06F 1/20* (2013.01); *H05K 7/1487* (2013.01)

(58) Field of Classification Search
CPC .. H05K 7/1427; H05K 7/1435; H05K 7/1487; H05K 7/1488; A47B 57/52; H01M 2/1016; G06F 1/20
USPC .................................................. 361/724–727
See application file for complete search history.

(56) References Cited

U.S. PATENT DOCUMENTS

| 6,061,966 A * | 5/2000 | Nelson ..................... E05C 17/14 220/831 |
| 6,185,098 B1 * | 2/2001 | Benavides ........... H05K 7/1488 174/387 |
| 2012/0007478 A1 * | 1/2012 | Fan ....................... H05K 7/1488 312/223.2 |
| 2012/0012544 A1 * | 1/2012 | Fan ....................... H05K 7/1488 211/26 |
| 2012/0013236 A1 * | 1/2012 | Fan ....................... H05K 7/1488 312/351.1 |
| 2012/0031965 A1 * | 2/2012 | Thielmann ........... H05K 7/1421 235/375 |
| 2012/0043869 A1 * | 2/2012 | Liu ....................... H05K 7/1488 312/223.2 |
| 2013/0091689 A1 * | 4/2013 | Mimlitch, III ....... H05K 7/1488 29/525.01 |
| 2013/0214654 A1 * | 8/2013 | Yang .................... H05K 7/1488 312/201 |
| 2013/0220953 A1 * | 8/2013 | Liang ..................... G06F 1/183 211/26 |
| 2014/0159554 A1 * | 6/2014 | Liu ....................... H05K 7/1488 312/223.2 |
| 2014/0185246 A1 * | 7/2014 | Sun .......................... H05K 7/18 361/724 |
| 2014/0190910 A1 * | 7/2014 | Arflack .................. A47B 55/00 211/26 |
| 2014/0196394 A1 * | 7/2014 | Greeson ............... H05K 7/1497 52/404.2 |

* cited by examiner

Primary Examiner — Adrian S Wilson
(74) Attorney, Agent, or Firm — Raymond Sun

(57) ABSTRACT

A frame structure for a cabinet enclosure has a front frame assembly having first and second front pillars, a rear frame assembly having first and second rear pillars, a first side brace member, and a second side brace member, each having a beam that has opposite ends, with the opposite ends of each side brace member connected to one of the front pillars and one of the rear pillars.

6 Claims, 19 Drawing Sheets

MODULAR RACK ASSEMBLY

BACKGROUND OF THE INVENTION

1. Field of the Invention

The present invention generally relates to a modular racks or enclosures for housing equipment, and more particularly to a frame structure for an assembled rack or enclosure for housing data processing, networking, and audio video or similar equipment.

2. Description of the Prior Art

Racks or enclosures are commonly used for housing electronic equipment, including but not limited to data processing, networking, information technology, audio and video equipment. In places like data centers and other facilities for data intensive applications, clusters of racks and enclosures are used for housing hundreds and thousands of electronic equipment. Further, with ever-increasing power and the reduction in size of electronic hardware, there are increased concerns relating to power distribution, ventilation, cable management, and load capacity at the rack level. People are constantly looking for equipment racking systems with increased reliability, yet are flexible enough to serve a variety of application scenarios, capable of meeting industry standards, and yet simple in configuration and also being cost effective.

At present, conventional cabinets used for these applications normally have front and rear frames, and then each cabinet is assembled with side brace members by using screws, so as to form the cabinet frame. The side brace member and the frame are in planar contact without any buckles or other retaining means. Racks or enclosures assembled in this manner have relatively low load capacity and poor stability.

Furthermore, data centers arrange racks or enclosures in a hot-aisle/cold aisle layout for greater data center capacity and efficiency, which requires much more efficient infrastructure and equipment housing design with the flexibility to support growth. For example, installing side barrier panels between cabinets is extremely important in segregating each cabinet for better airflow control. However, when baying cabinets, it is often impossible to install side panels without using modified custom side panels or cabinet structures, otherwise it will be very difficult to pull out individual cabinets from a row for replacement or repair. Therefore, the versatility is poor.

In addition, current rack and enclosure products do not provide an integral solution for installation of power distribution units (PDU) or cable management, but instead requires installation of additional accessories which increase workload and costs.

SUMMARY OF THE DISCLOSURE

It is an object of the present invention to provide a frame structure for an enclosure cabinet that overcomes the drawbacks described above.

In order to accomplish the objects of the present invention, a frame structure for a cabinet enclosure is provided. The frame structure has a front frame assembly having first and second front pillars, a rear frame assembly having first and second rear pillars, a first side brace member, and a second side brace member, each having a beam that has opposite ends, with the opposite ends of each side brace member connected to one of the front pillars and one of the rear pillars.

The frame structure of the present invention provides the following aspects.

A first aspect of the present invention is directed to improving the structural stability and load capacity of the frame structure for housing equipment. The frame structure includes a front frame, a rear frame, side brace members, limiting and retaining members provided on the frames to place and reinforce the side brace members in contact with the front and rear frames, and connecting structures provided on the side brace member and the front frame or the rear frame to restrict and fasten the side brace members with the front and rear frames. The limiting members on the frames restrict and fix the side brace member to the frames, thereby increasing the stability of the assembled frame structure. The connecting structures pull the fastening surfaces together in a manner which allows for adjustability and stability. Because the fastening surface is recessed or distanced from the end edges of the side brace members, the fastening distance and thus the fastening force are adaptable. This elastic fastening structure along with frictional contact between surfaces behaves like an viscoelastic system which offers excellent resistance to impact forces or dynamic loads by absorbing energy. For example, tightening the fastener results in higher internal tension force inside the fastener, and the fastener in return applies a higher contacting force on the fastening surface. Because the side brace member has a fastening structure on both ends, it is under high compressional forces. These compressional forces reinforce the attachment of side brace member to the pillars of the frames and make the structure substantially rigid. Thus, the structural stability is greatly improved with high resilience to both in-plane (along the fastening direction) and out-of-plane (transverse to the fastening direction) external loads.

A second aspect of the present invention is directed to facilitating deployment and maintenance of the rack enclosures. The rack has a front frame, a rear frame, and side brace members connected with the frames, where the pillars of the front frame and rear frame have recessed surface profiles on the side. Even when side panels are installed on the side of the frames, the outer surfaces of these side panels are also recessed from the outermost surface of the frames. As a result, the side to side contact area (and thus frictional force) between adjacently deployed cabinets can be greatly reduced. The extra clearance provided by the recessed areas also makes the resulting cabinet compact and easier for gripping and maneuvering. Embodiments of such pillar design of the front frame assembly and the rear frame assembly may have one or multiple recessed profile surfaces. An increased number of bends and surfaces (surface areas) formed on the pillars facilitates overall strength of the pillar and frame structure.

A third aspect of the present invention is directed to facility installation and operation of entry plate of enclosure. The upper beam of the rear frame assembly has cable entry ports on the top surface of the beam or the top cover. The cable entry ports are used for installation of cable entry assembly. The cable entry assembly may include a mounting bracket and a brush structure, where the mounting bracket has an entrapment area defined by an angled/curved entrapment plate and fastening tabs for receiving the brush structure.

A fourth aspect of the present invention is directed to facilitate cable installation, routing and management within the cabinet enclosure. Pillars of the rear frame assembly or the front frame assembly can have T-shaped entry openings, hook openings, PDU mounting ports and cable entry ports, which facilitate installation, routing and organization of cables or other pass-through devices without the need for additional functional accessories.

A fifth aspect of the present invention is the provision of adjustable feet installed on the enclosure. The lower beam of the front frame assembly or the rear frame assembly has openings that facilitate the installation of threaded shafts for adjustable foot assemblies. The openings offer access to adjust the feet from inside the enclosure, so that the operator does not need to access the adjustable feet from outside the enclosure.

DETAILED DESCRIPTION OF THE PREFERRED EMBODIMENTS

Figure 1:
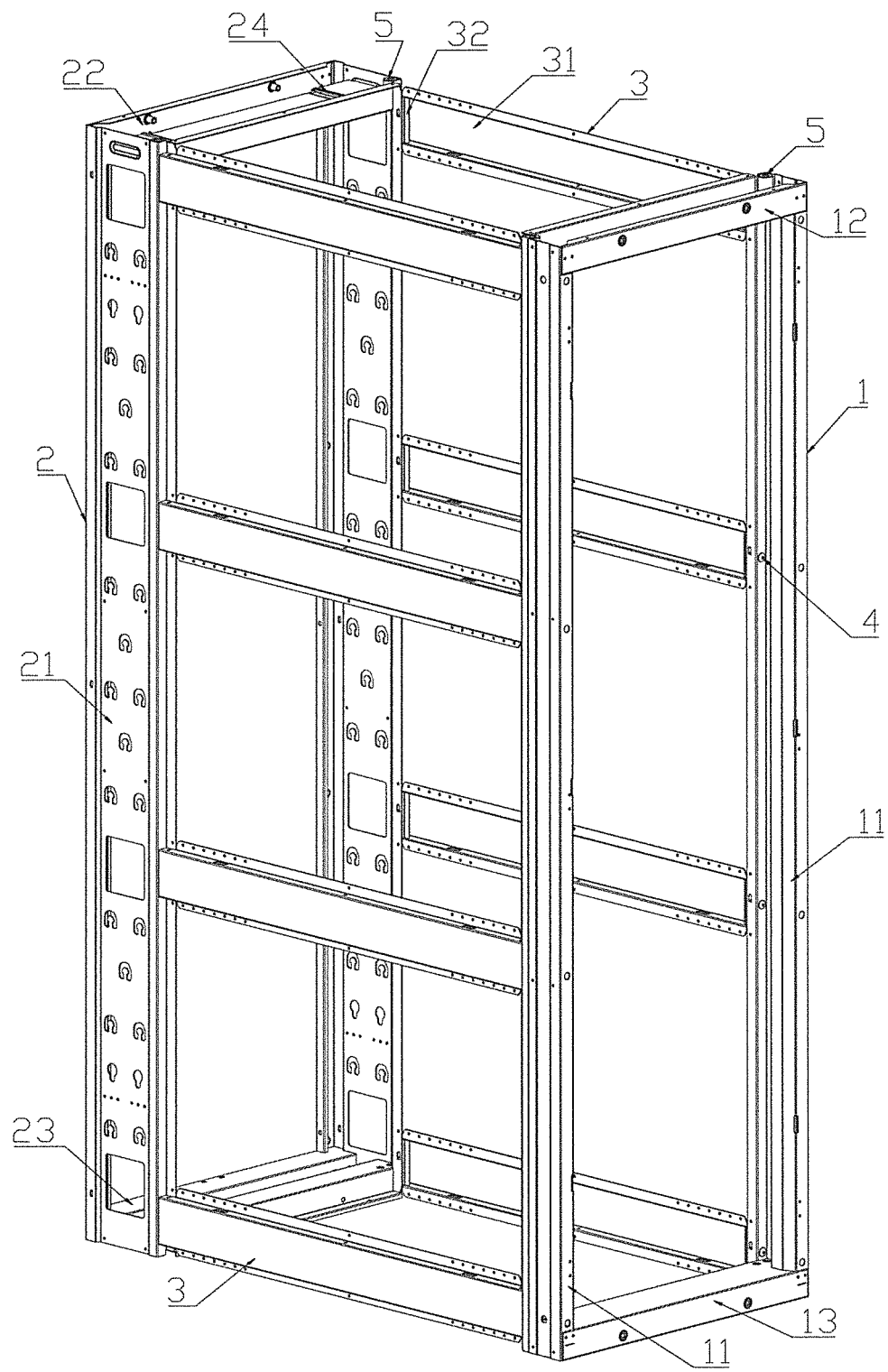
FIG. 1 is a perspective view showing the frame structure of the enclosure cabinet according to one embodiment of the present invention.
Figure 2:
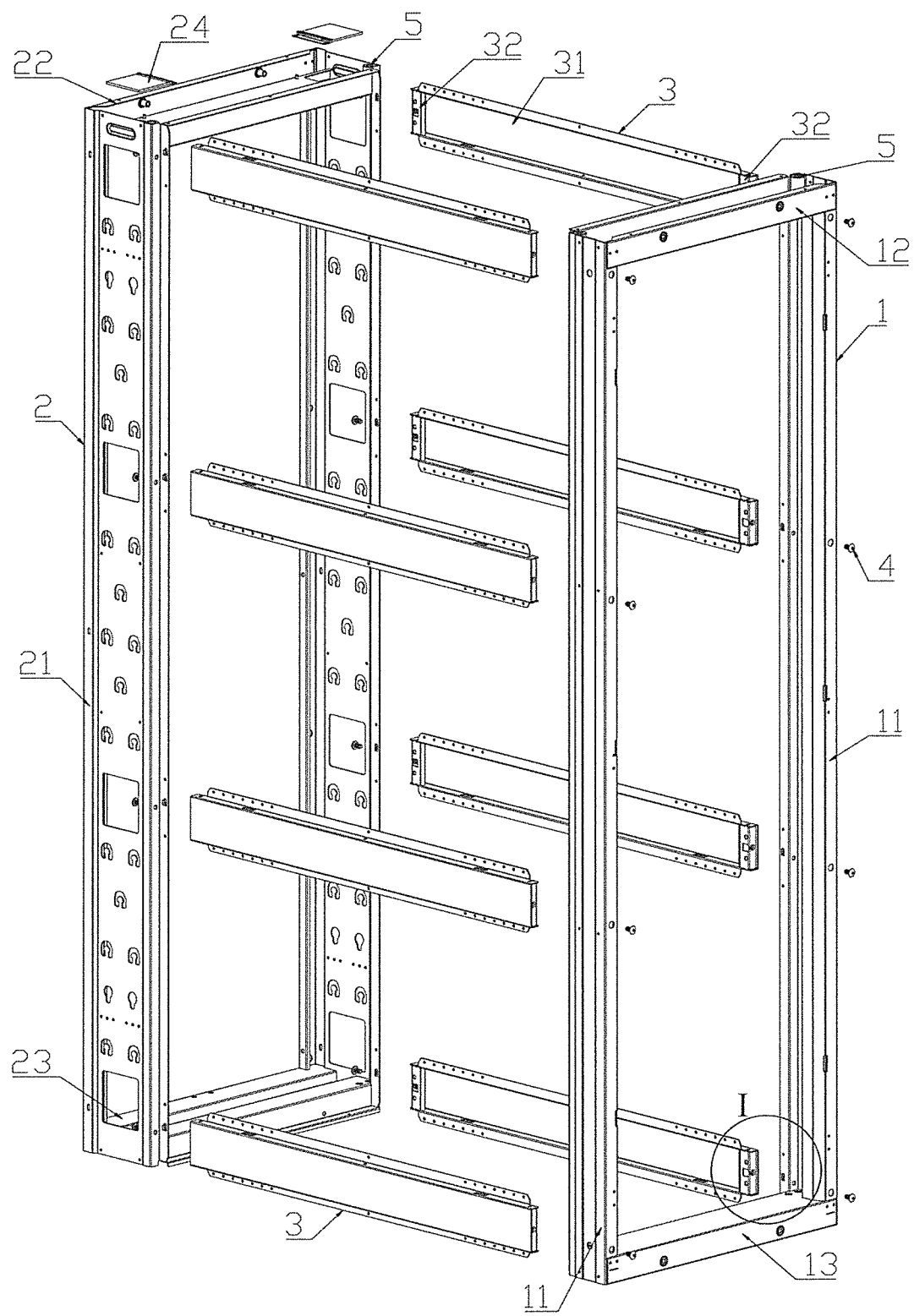
FIG. 2 is an exploded perspective view of the frame structure of FIG. 1.
Figure 3:
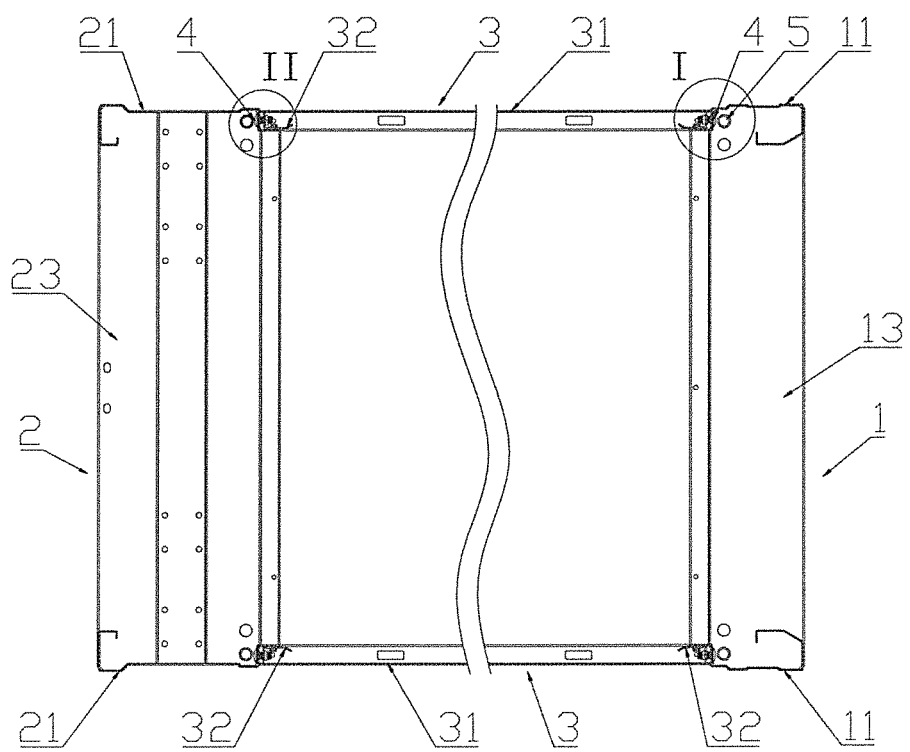
FIG. 3 is a cross-sectional view of the frame structure of FIG. 1 taken along the base thereof.
Figure 4A:
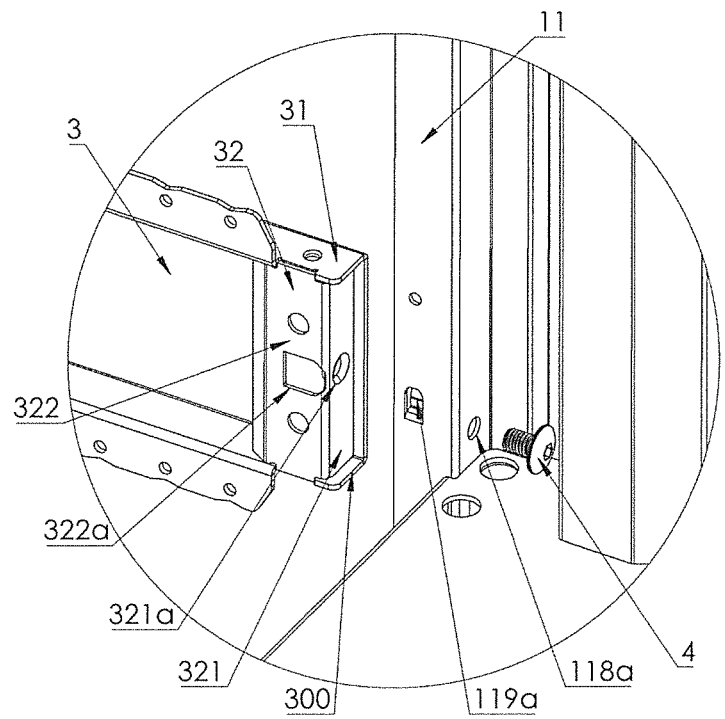
FIG. 4A is an enlarged exploded front perspective view of the area marked I in FIG. 3.
Figure 4B:
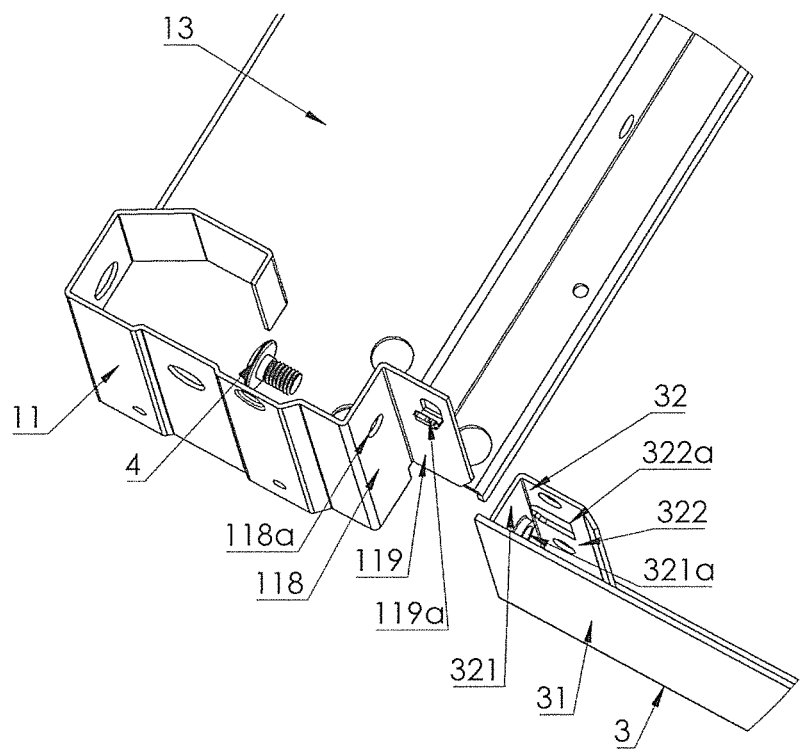
FIG. 4B is an enlarged exploded rear perspective view of the area marked I in FIG. 3.
Figure 5:
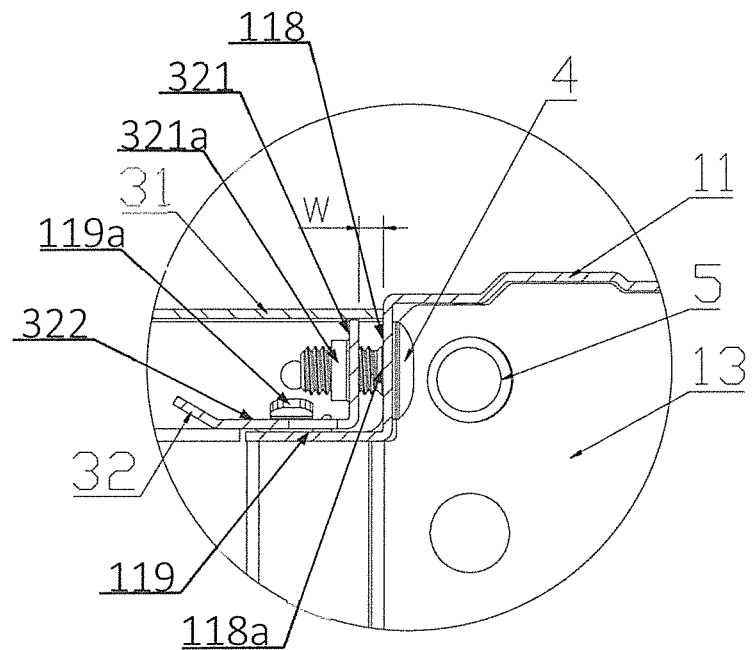
FIG. 5 is a cross-sectional view of the area marked I in FIG. 3
Figure 6:
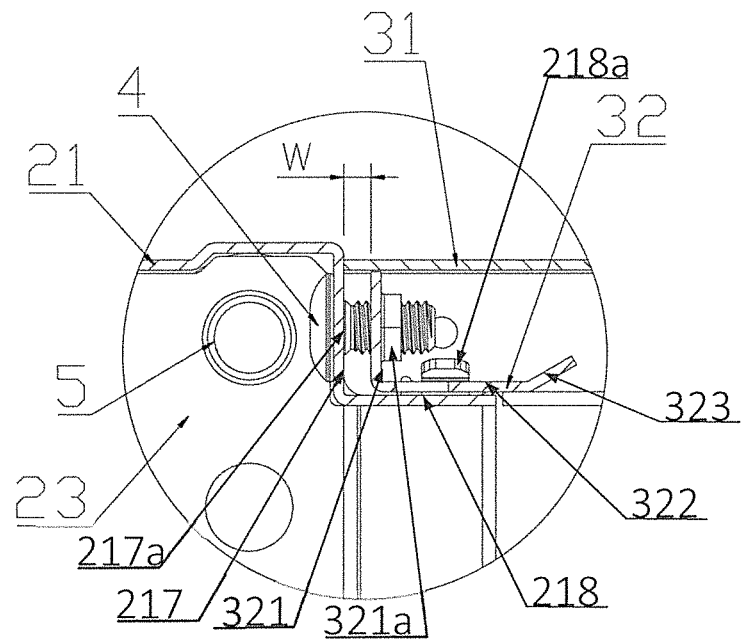
FIG. 6 is a cross-sectional view of the area marked II in FIG. 3.
Figure 7:
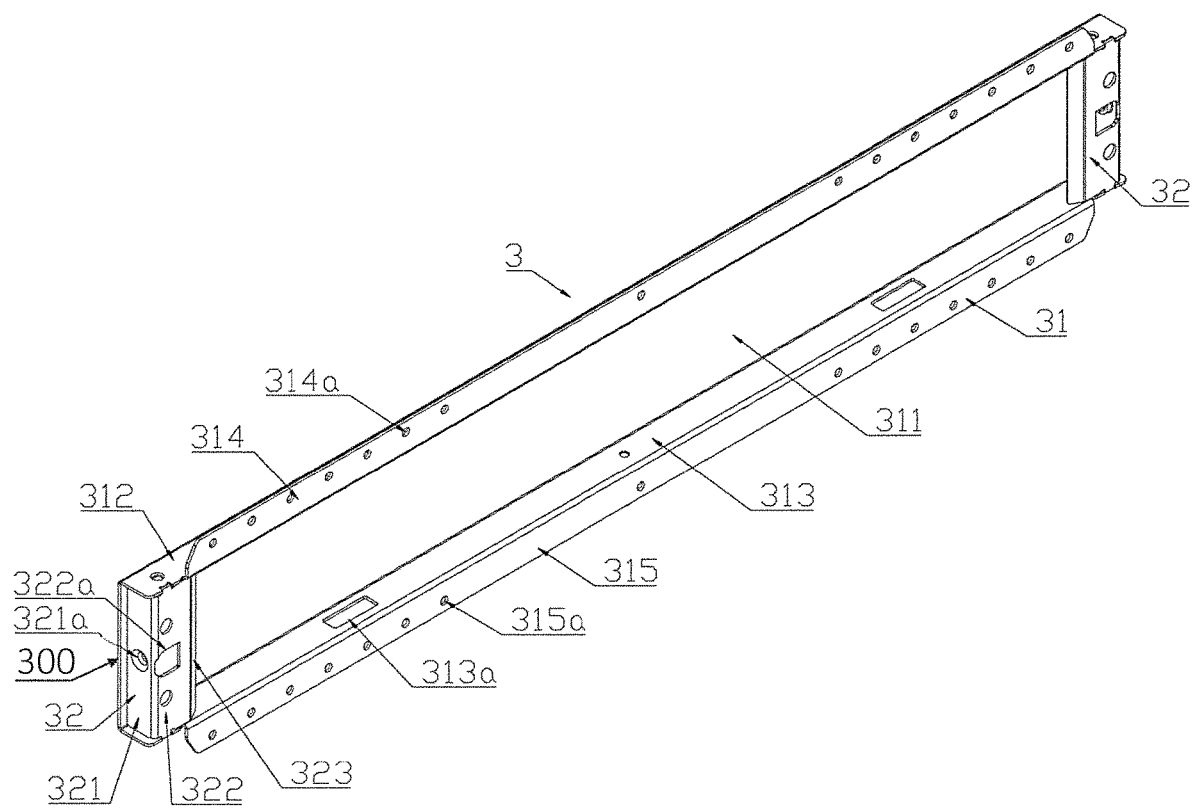
FIG. 7 is a perspective view of a side brace member of the frame structure of FIG. 1 with connecting brackets at both ends.
Figure 8A:
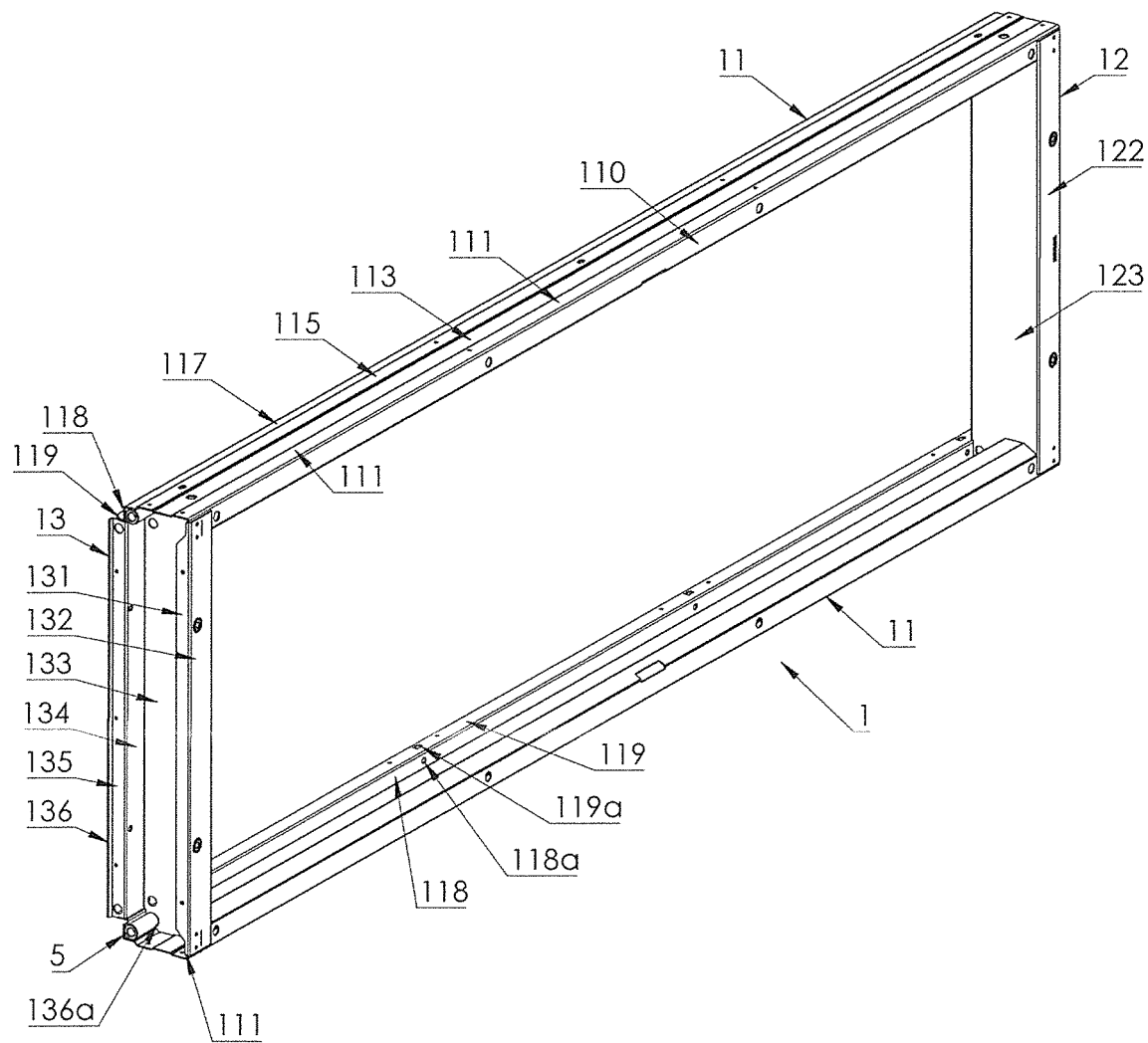
FIG. 8A is a perspective view of the front frame assembly of the frame structure of FIG. 1.
Figure 8B:
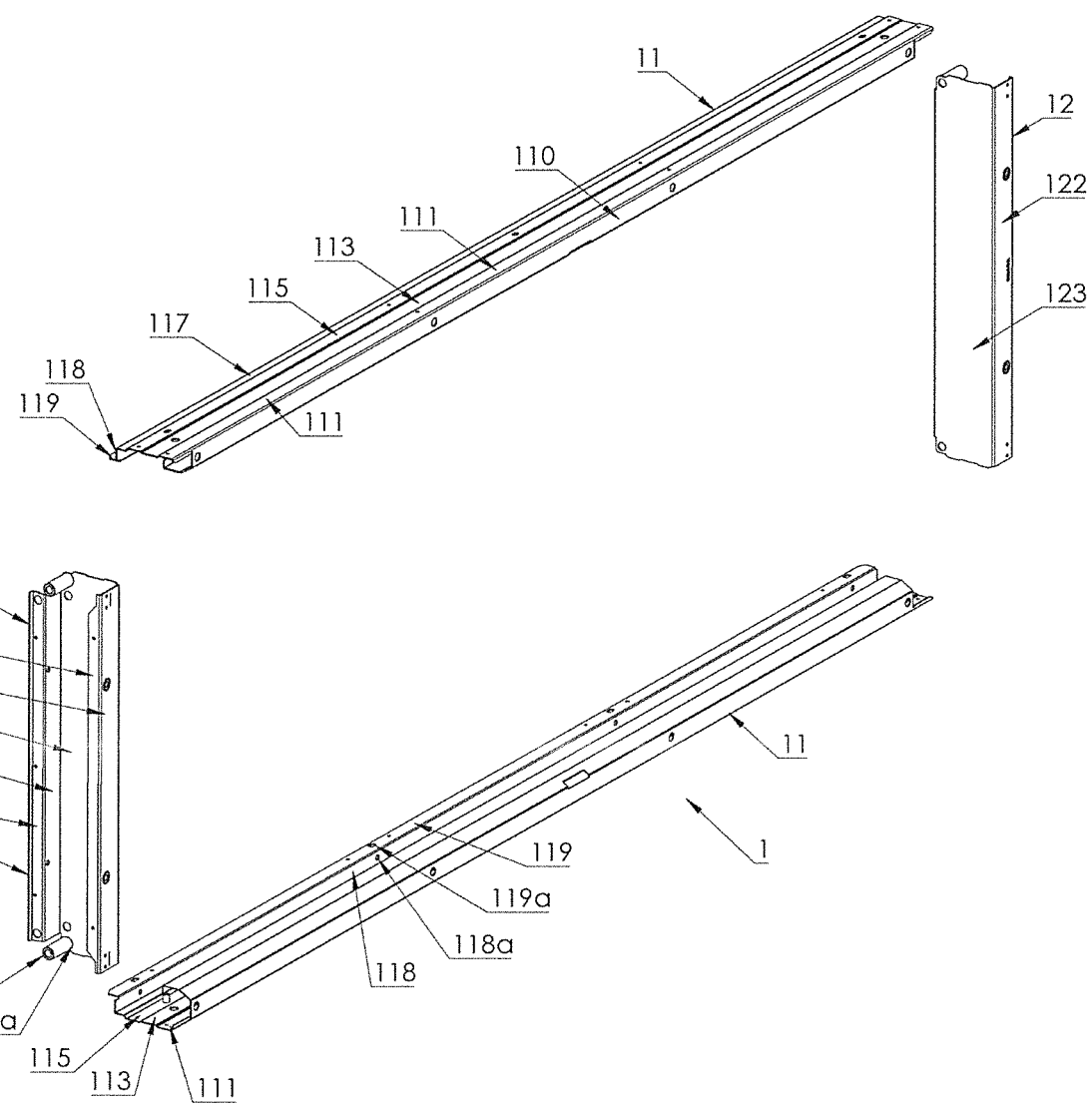
FIG. 8B is an exploded perspective view of the front frame assembly of FIG. 8A.

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Referring to FIGS. 1-3 and 21-25, the frame structure of the cabinet enclosure of the present invention includes a front frame assembly 1, a rear frame assembly 2, two side brace members 3, and connectors (e.g., bolts) 4 to fasten the side brace members 3 with the frame assemblies 1 and 2. Side panels 6 can be installed on the surface defined by recessed flange surfaces 314, 315 of the side brace members 3. A top cover 7 can be installed on the top of the front frame assembly 1 and the rear frame assembly 2. A base 8 can be installed on the bottom of the front frame assembly 1 and the rear frame assembly 2.

Referring to FIGS. 8A to 11, the front frame assembly 1 has two front pillars 11, a front upper frame beam 12, and a front lower frame beam 13. The upper end of the front pillars 11 are connected to the front upper frame beam 12, and the lower end of the front pillars 11 are connected to the front lower frame beam 13. The front pillar 11 can be provided with a retaining member, such as a hook 119a, which can be provided on a mounting surface 119 which functions as a limiting member. Each is front pillar 11 may further include a fastening member, such as a mounting hole 118a, on a fastening surface 118.

Figure 9:
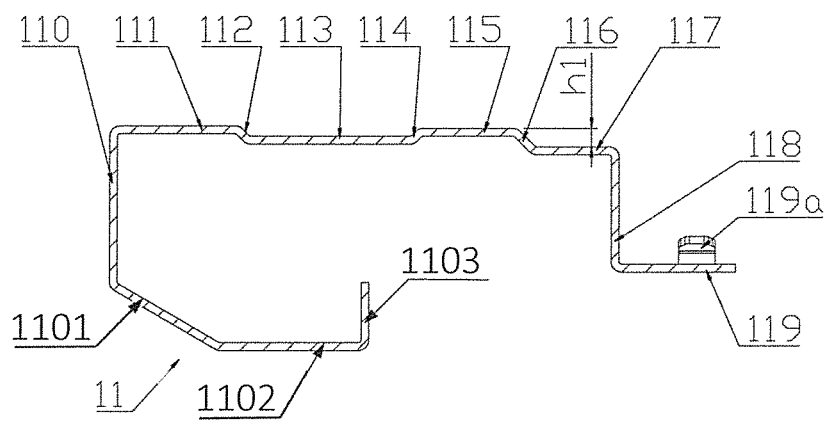
FIG. 9 is a cross-sectional view of the front pillar of the front frame assembly of FIG. 8A.

As best shown in FIG. 9, the front pillar 11 can be formed by forming multiple surfaces using methods such as bending a metal plate. The front pillar 11 has a front surface 110. One end of an angled surface 1101 extends from one end of the front surface 110, and the other end of the angled surface 1101 transitions into an enclosing surface 1102, which ends in a lip 1103 that extends about ninety degrees from the enclosing surface 1102. The other end of the front surface 110 is bent inwardly by about ninety degrees into a front side that has two raised surfaces 111 and 115. A first recessed surface 113 is formed between the two raised surfaces 111 and 115 via transition surfaces 112 and 114, respectively. From the raised surface 115 opposite to the transition surface 114 is another transition surface 116 that leads to a second recessed surface 117. The two recessed surfaces 113 and 117 are both parallel to the raised surfaces 111 and 115. The second recessed surface 117 is bent inwardly by ninety degrees to form a fastening surface 118, and then is further bent outwardly by ninety degrees to form a limiting member, which is a mounting surface 119. The mounting surface 119 can have a width of 1 to 50 mm. The surfaces 111, 113, 115 and 117 are parallel with the surface 1102. A retaining member, such as a hook 119a, can be provided on the mounting surface 119, and a fastening member, such as a mounting hole 118*a*, can be provided on the fastening surface 118.

Figure 24:
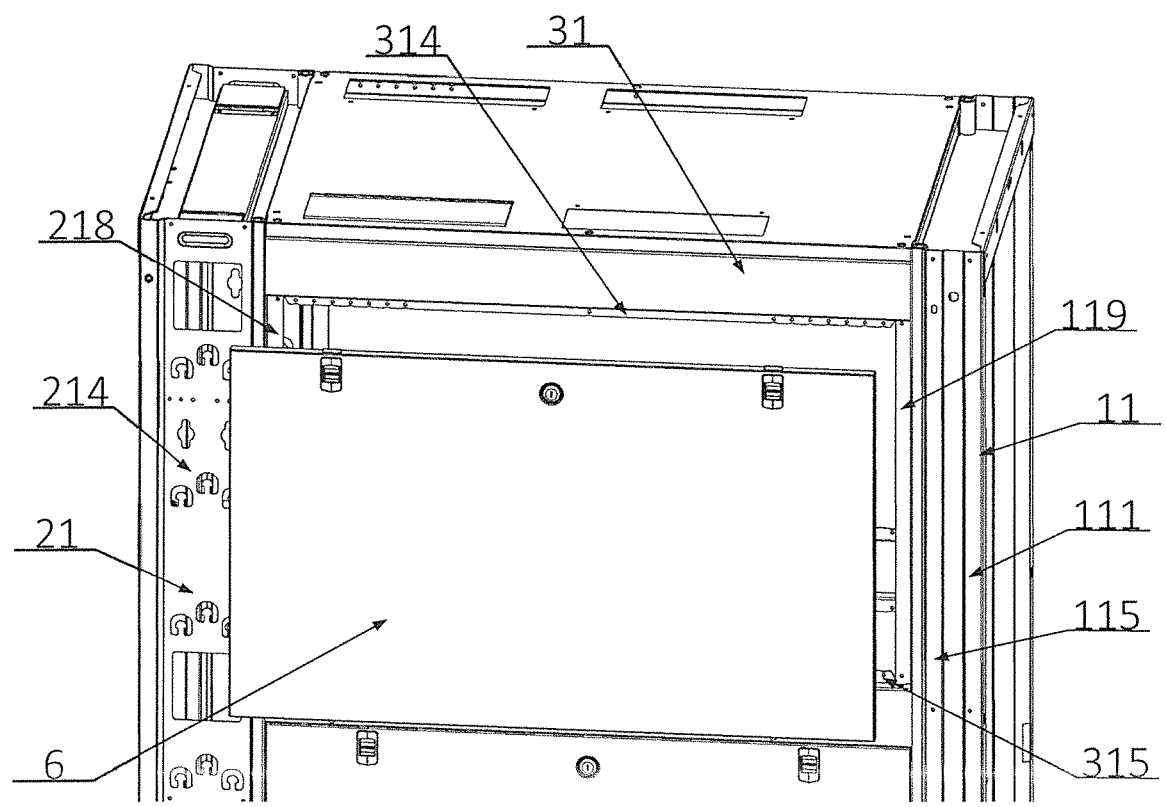
FIG. 24 is a side view of the enclosure cabinet of FIG. 21 showing how the side panels are connected.
Figure 25:
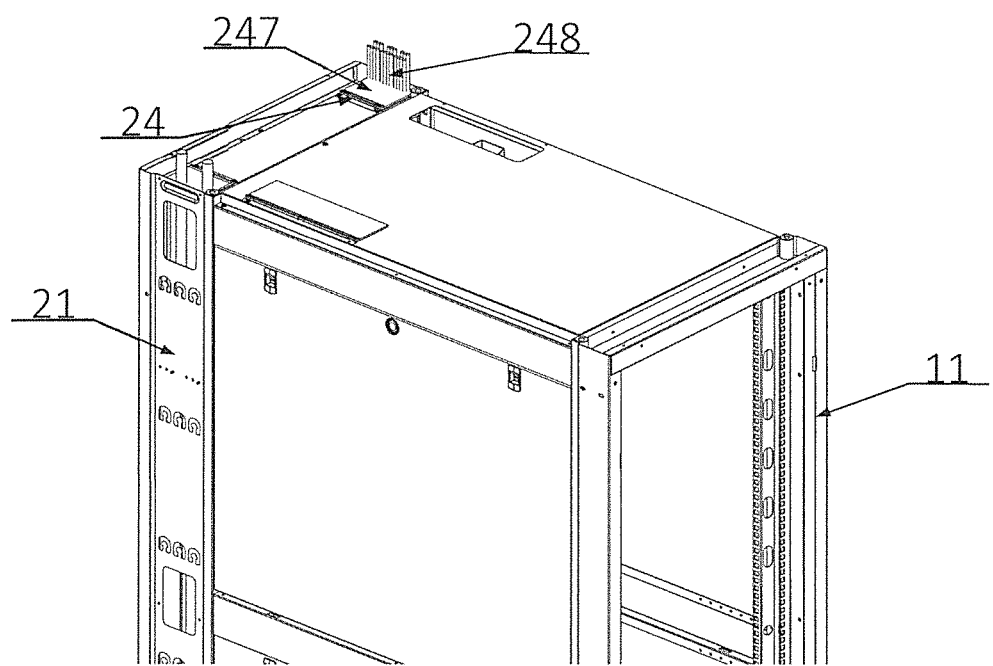
FIG. 25 is a top perspective view of the enclosure cabinet of FIG. 21.

The offset distance h1 between the recessed surfaces 113 and 117 and the raised surfaces 111 and 115 is between 1 to 25 mm. These bends and transition surfaces increase the rigidity of the front pillar 11 against bending moment and deflection forces applied to it, thereby improving the strength and stability of the front frame assembly 1. As shown in FIG. 24, the side panels 6 are installed on the recessed flange surfaces 314, 315 of the side brace members 3 (as described below), the mounting surface 119 of the front frame assembly, and the mounting surface 218 (as described below) of the rear frame assembly. After installation of the front frame assembly 1, the rear frame assembly 2 and the side panels 6, the outer surface of each side panel 6 is recessed from the raised surfaces 111 and 115 of the front frame pillar 11, and the raised surface 212 of the rear frame pillar 21. Since the recessed distance is equal to or less than the offset distance h1 of 1 to 25 mm, when a plurality of these cabinet enclosures are bayed side by side (e.g., see FIG. 23), even if these cabinet enclosures have preinstalled side panels 6, the contact surface area at the front frame assembly 1, the rear frame assembly 2 and side panels 6 between the adjacent cabinet enclosures will be small, and less than 5% of the total side area of the cabinet enclosure.

Figure 10:
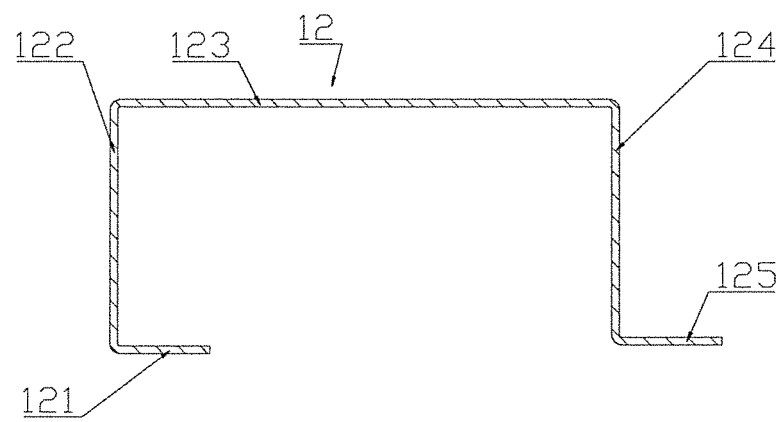
FIG. 10 is a cross-sectional view of the upper frame beam of the front frame assembly of FIG. 8A.

As best shown in FIG. 10, the front upper frame beam 12 can also be formed by forming multiple surfaces using methods such as bending a metal plate. The plate is first bent inwardly by ninety degrees to form one side of a first surface 121 into a second surface 122, and then bent inwardly by ninety degrees to form a third plane 123, from which another inward ninety-degree bend forms a fourth surface 124. Finally, a further outward ninety-degree bend forms a fifth surface 125.

Figure 11:
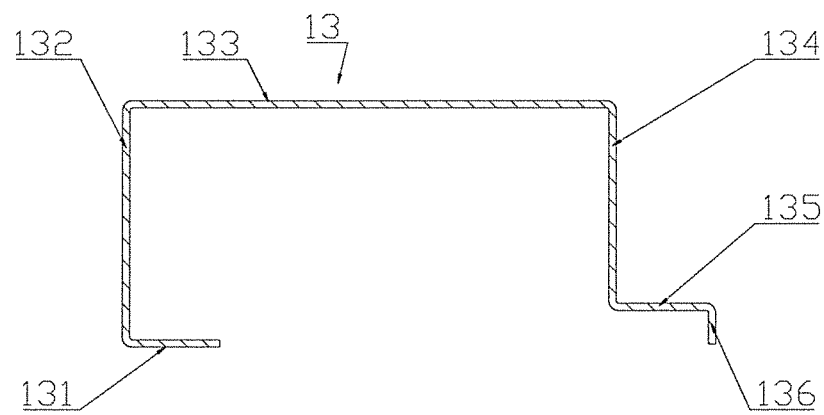
FIG. 11 is a cross-sectional view of the lower frame beam of the front frame assembly of FIG. 8A.

As best shown in FIG. 11, the front lower frame beam 13 can also be formed by bending a plate material. The first surface of the front side of the lower frame beam 131 is bent inwardly by ninety degrees to form a second surface 132, then bent ninety degrees inwardly to form a third surface 133, and a further inward ninety-degree bend forms a fourth surface 134. From there, a fifth surface 135 is formed by bending outwardly by ninety degrees, and then a further inward ninety-degree bend results in a sixth surface 136.

Referring to FIGS. 12A to 15, the front frame assembly 2 has two rear pillars 21, a rear upper frame beam 22, and a rear lower frame beam 23. The upper end of the rear pillars 21 are connected to the rear upper frame beam 22, and the lower end of the rear pillars 21 are connected to the rear lower frame beam 23. Each rear pillar 21 may include a retaining member, such as a hook 218*a*, on a mounting surface 218 which functions as a limiting member, and a fastening member, such as a mounting hole 217*a*, on a fastening surface 217.

Figure 13:
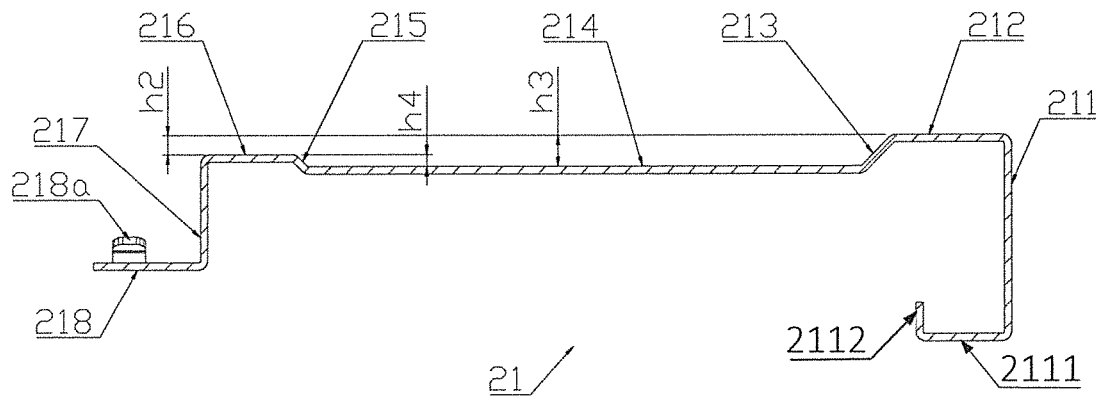
FIG. 13 is a cross-sectional view of the rear pillar of the rear frame assembly of FIG. 12A.

As best shown in FIG. 13, each rear pillar 21 can be formed by bending a plate material such as a metal plate. Each rear pillar 21 has a rear front surface 211. One end of a lateral surface 2111 extends by ninety degrees from one end of the rear front surface 211, and the other end of the lateral surface 2111 is bent inwardly by about ninety degrees into a lip 2112. The other end of the rear front surface 211 is bent inwardly by about ninety degrees to form a raised side surface 212, and then bent inwardly at an angle to form a transition surface 213, and further bent outwardly to form a recessed surface 214 parallel to the rear side surface 212 and the lateral surface 2111. The recessed surface 214 is then angled outwardly into another transition surface 215, and then bent inwardly to form a raised surface 216 which is also parallel with the surface 214. From the raised surface 216, the plate is bent inwardly by ninety degrees to form a fastening surface 217, then further bent outwardly by 90 degrees to form a mounting surface 218 which functions as a limiting member. The mounting surface 218 can have a width of 1 to 50 mm. Each rear pillar 21 has a retaining member, such as a hook 218*a*, on the mounting surface 218, and a fastening member, such as a mounting hole 217*a*, on the fastening surface 217.

Furthermore, the recessed surface 214 is provided with T-shaped entry openings 214*a*, hook openings 214*b*, PDU mounting ports 214*c*, and cable entry ports 214*d*. These features are arranged on the rear pillars 21 so as to meet the multifunctional needs of the customer, including installation, routing and organization of cables or other pass-through devices, without the need for additional accessories.

The offset distance h4 between the recessed surface 214 and the raised surface 216 is between 1 to 25 mm. The distance h3 between the rear side surface 212 and the recessed surface 214 is larger than h4. Similar to the front pillar 11, these bends and transition surfaces increase the rigidity of the rear pillar 21 against bending moment and deflection forces applied to it, thereby improving the strength and stability of the rear frame assembly 2.

The offset distance h1 between the recessed surface 117 and the raised surface 115 in FIG. 9 may be equal to the offset distance h2 between the raised surface 216 and the rear side surface 212 in FIG. 13. The value of h1 and h2 can be between 1 to 25 mm.

Figure 14:
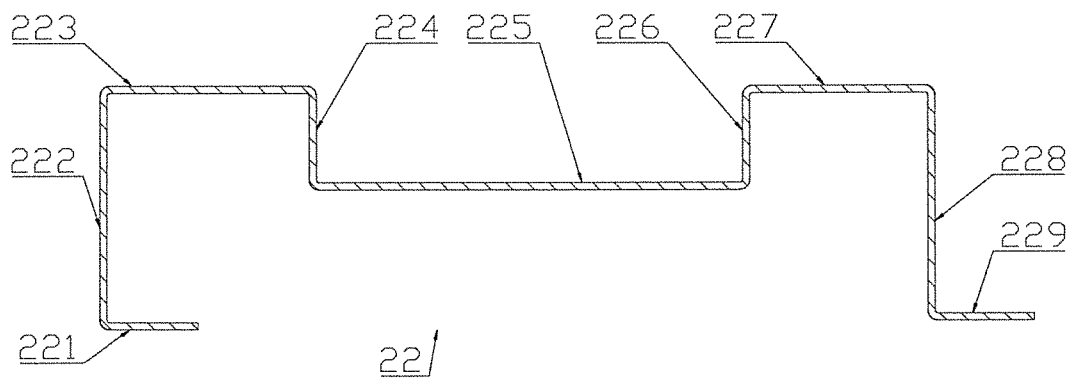
FIG. 14 is a cross-sectional view of the upper frame beam of the rear frame assembly of FIG. 12A.

As best shown in FIG. 14, the rear upper frame beam 22 can be formed by bending a plate material such as a metal plate. One side of a first surface 221 is bent inwardly by ninety degrees into a second surface 222, and then bent inwardly by ninety degrees to form a third surface 223, and then bent ninety degrees into a fourth surface 224, and then bent outwardly ninety degrees to form a fifth surface 225, and then bent outwardly by ninety degrees into a sixth surface 226, and then bent ninety degrees inwardly to form a seventh surface 227. From the seventh surface 227, a ninety-degree inward bend forms an eighth surface 228, and then the plate material is bent outwardly by ninety degrees to form a ninth surface 229. The surfaces 229 and 221 are on the same plane. The surface 225 is recessed from the surfaces 223 and 227, and the surfaces 222 and 228 are generally parallel to each other.

Figure 15:
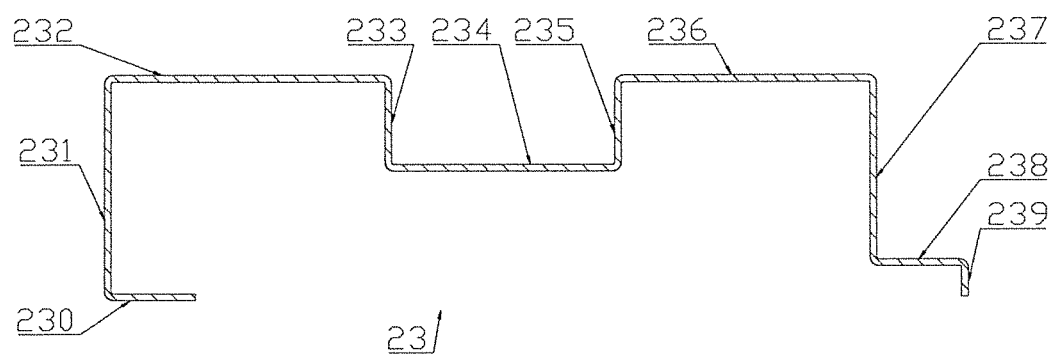
FIG. 15 is a cross-sectional view of the lower frame beam of the rear frame assembly of FIG. 12A.

As best shown in FIG. 15, the rear lower frame beam 23 can be formed by bending a plate material such as a metal plate. One side of a first surface 230 is bent inwardly by ninety degrees into a second surface 231, and then bent inwardly ninety degrees to form a third surface 232, then bent another ninety degrees to form a fourth surface 233, then bent outwardly ninety degrees to form a fifth surface 234, then bent outwardly ninety degrees to form a sixth surface 235, and then bent ninety degrees inwardly to form a seventh horizontal surface 236. From the seventh surface 236, a further ninety-degree inward bend forms an eighth surface 237, and then the plate material is bent outwardly ninety degrees into a ninth surface 238, and then bent another ninety degree to form a lip 239. The surface 234 is recessed from the surfaces 232 and 236, and the surfaces 231 and 237 are generally parallel to each other.

Figure 12A:
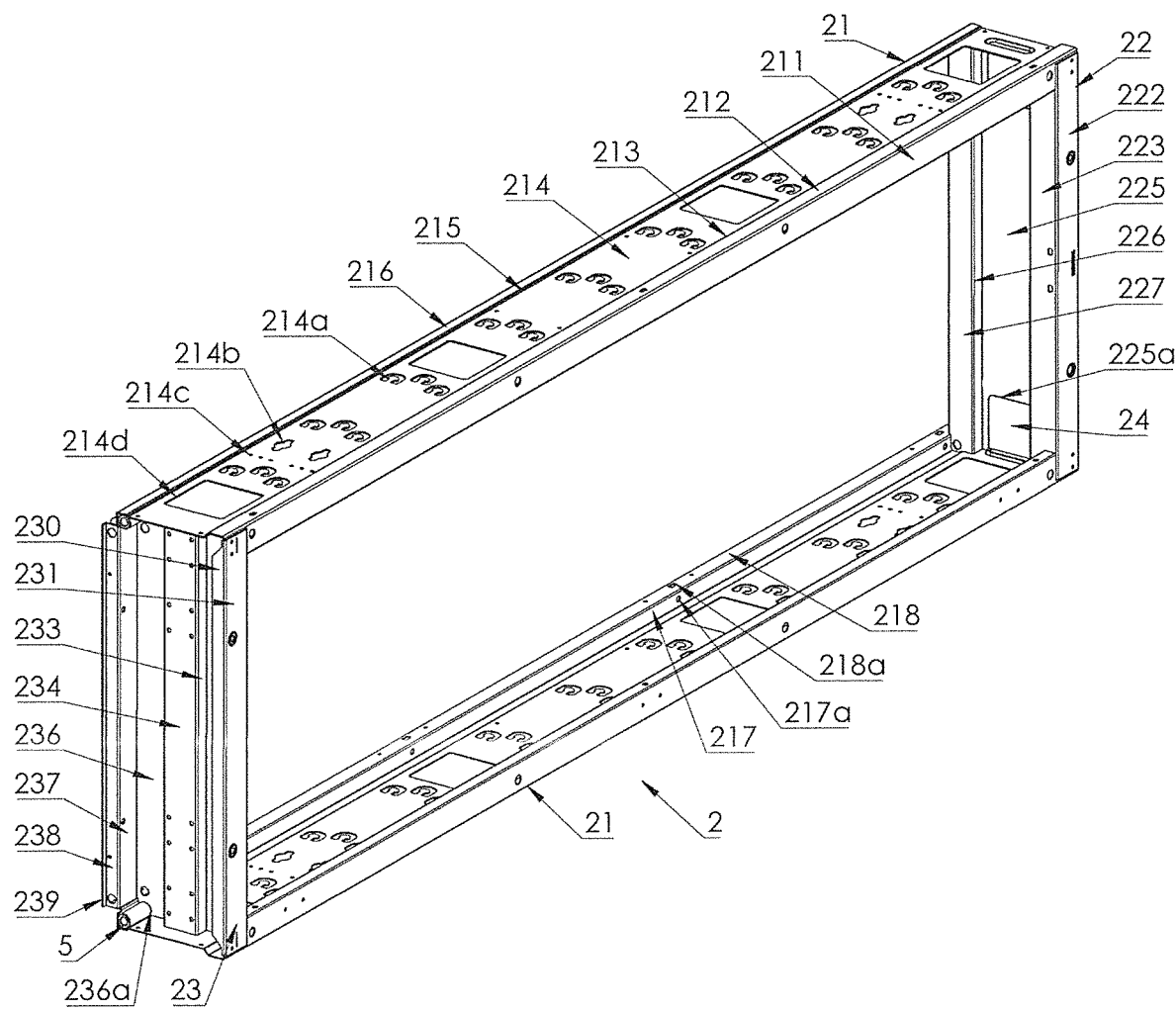
FIG. 12A is a perspective view of the rear frame assembly of the frame structure of FIG. 1.
Figure 12B:
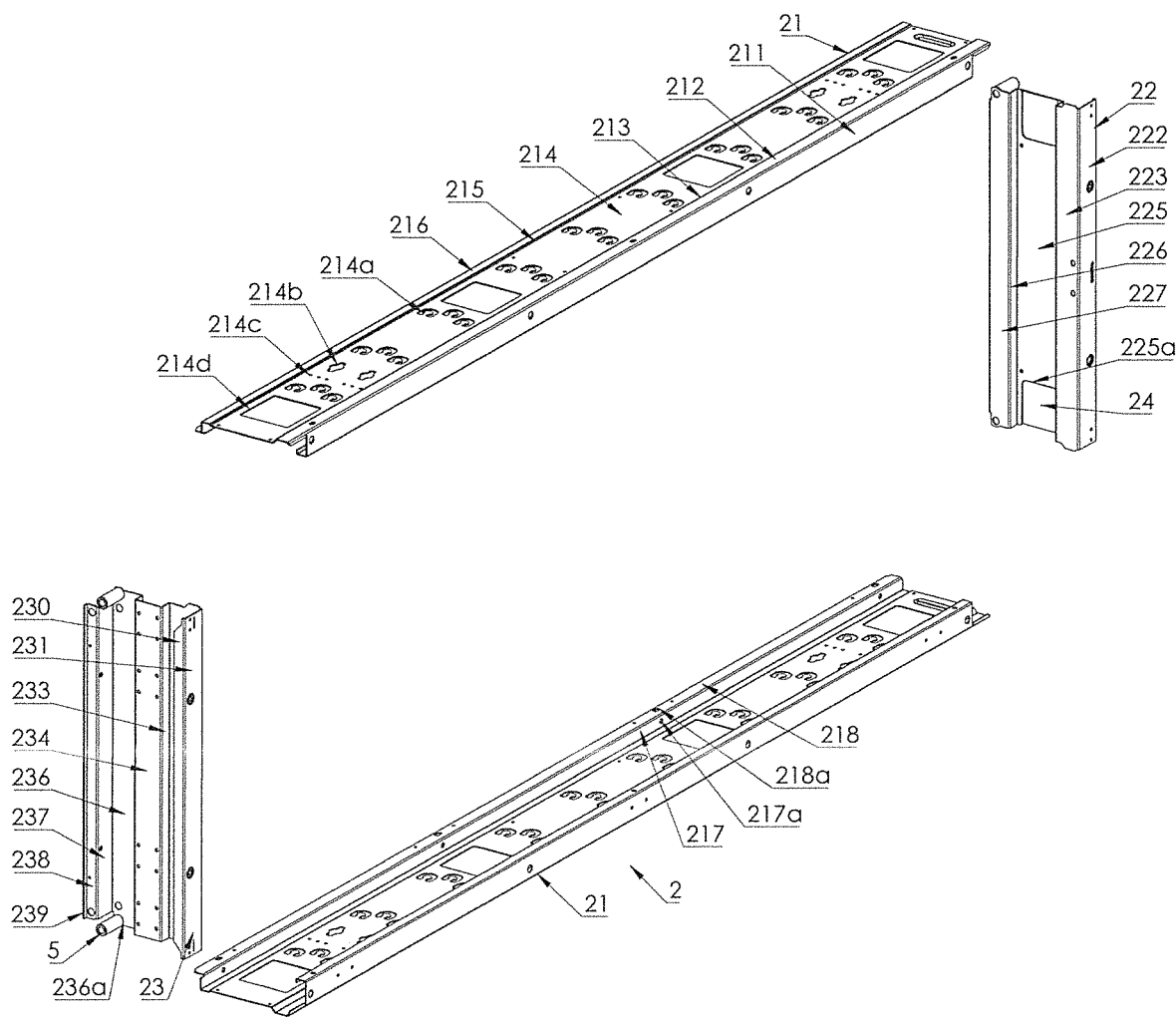
FIG. 12B is an exploded perspective view of the rear frame assembly of FIG. 12A.
Figure 16:
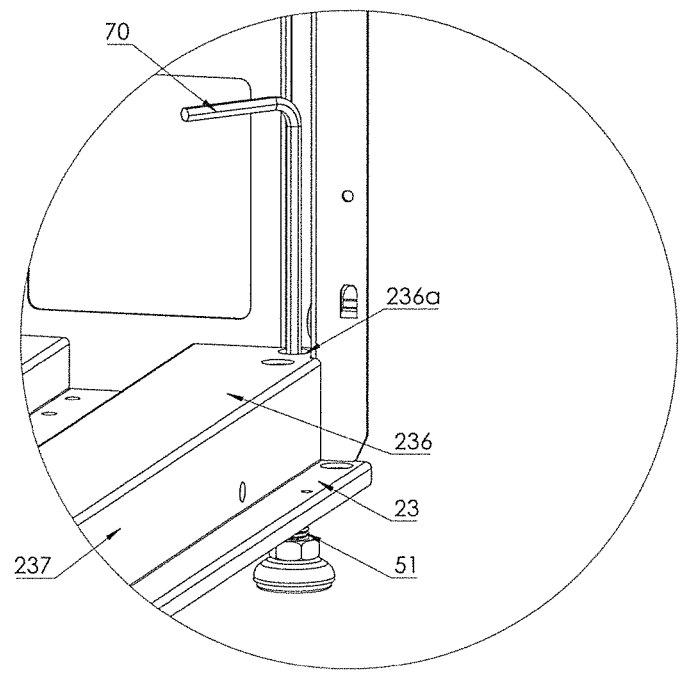
FIG. 16 is an enlarged perspective view of the rear frame assembly showing a leveling foot subassembly.
Figure 17:
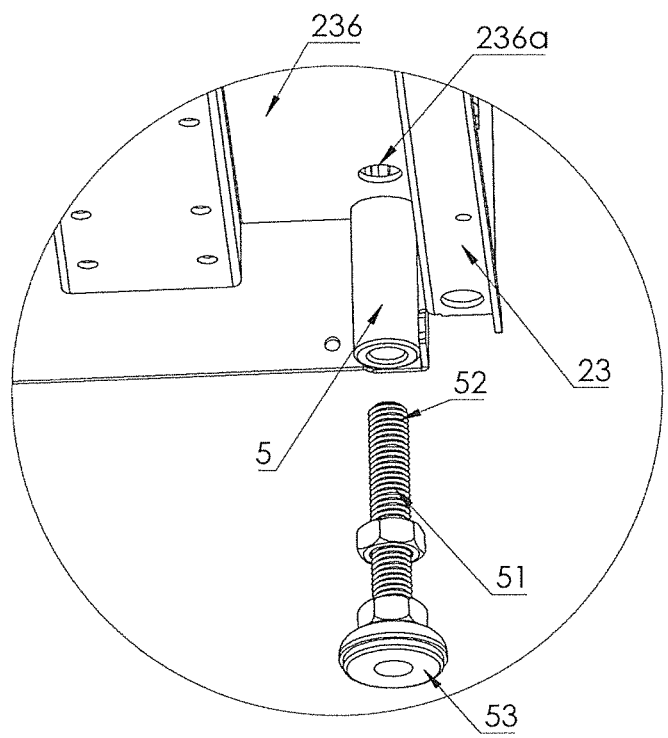
FIG. 17 is an exploded bottom view of the leveling foot subassembly of FIG. 16.
Figure 18:
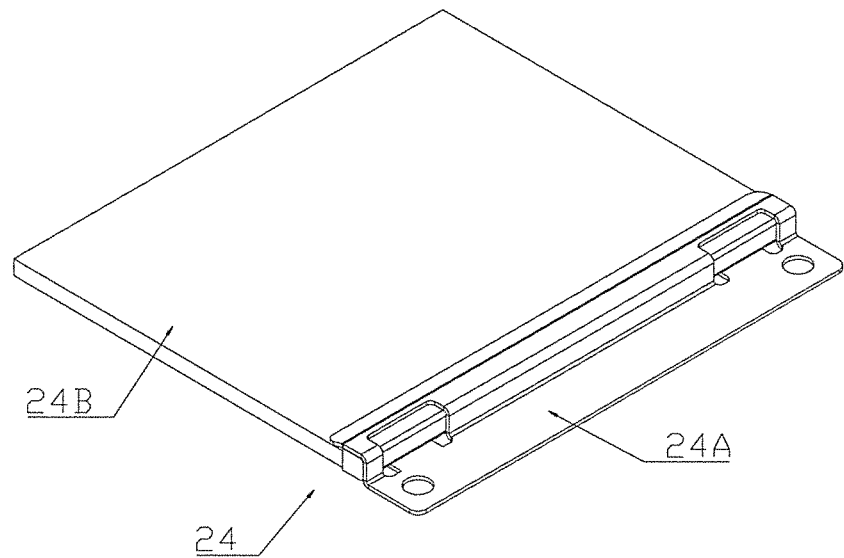
FIG. 18 is a perspective view of a cable entry assembly for the present invention.
Figure 19:
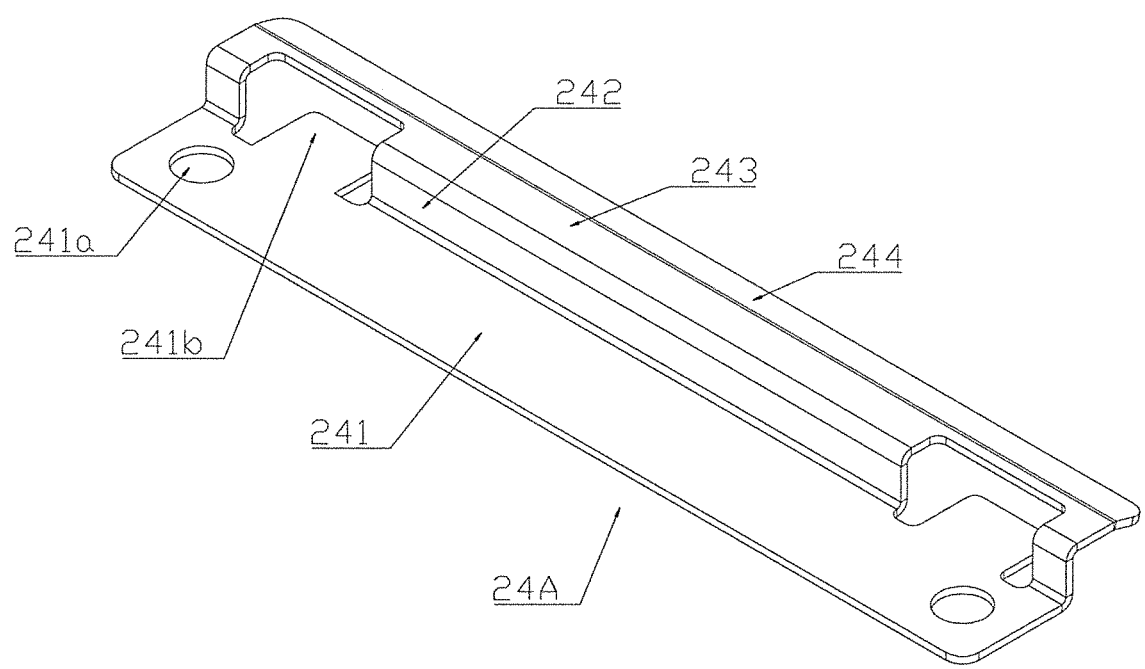
FIG. 19 is a perspective view of a mounting bracket for the cable entry assembly of FIG. 18.
Figure 20:
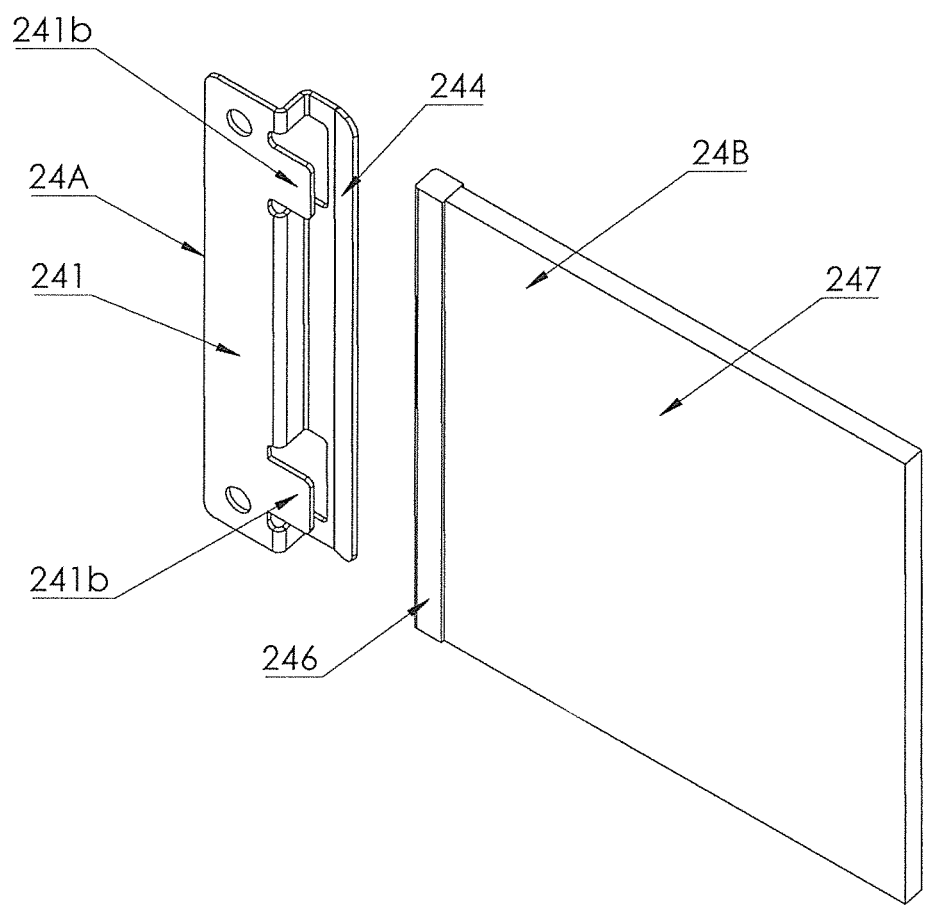
FIG. 20 is an exploded perspective view of the cable entry assembly of FIG. 18.

Referring to FIGS. 12A, 16 and 17, an adjustable foot assembly is provided on the rear lower frame beam 23. The foot assembly has a cylinder 5 with a threaded bore, and a threaded bolt 51 that functions as a leg. The cylinder 5 is positioned below the surface 236, and adjacent the surface 237. Openings 236a are provided in the surface 236 above the cylinder 5. The threaded bolt 51 has a threaded shaft 52 and a flat head 53 that functions as a stand for the foot. In use, the shaft 52 is threaded into the threaded bore of the cylinder 5, and the position of the head 53 can be adjusted up or down by turning the shaft 52 inside the threaded bore. This can be accomplished by inserting an end of a wrench tool 70 through the opening 236a into the threaded bore to engage the end of the shaft 52. Similarly, referring to FIG. 8A, the front lower frame beam 13 of the front frame assembly 1 may have similar openings 136a on the surface 133 to access similar cylinders 5. Thus, the height of the lower frame beams 13 and 23 off the ground can be easily and quickly adjusted by inserting the wrench tool 70 through the openings 136a and 236a, without the need to effectuate the adjustment from underneath the lower frame beams 13 and 23. In other words, the openings 136a and 236a offer access to adjust the threaded bolt 51 from inside the enclosure, so that the operator does not need to access the threaded bolt 51 from outside the enclosure.

Referring to FIGS. 4A, 4B, 5, 6 and 7, the side brace member 3 has a beam 31 and connecting brackets 32 attached on both ends of the beam 31. Each beam 31 has a recessed surface 311 with two vertical surfaces 312 and 313 extending by ninety degrees from either end of the recessed surface 311. Two flange surfaces 314 and 315 extend by ninety degrees from the vertical surfaces 312 and 313, respectively. The beam 31 can also be formed by bending a plate material, such as metal.

Each connecting bracket 32 has retaining members, such as slots 322a, provided on a mounting surface 322 of the connecting bracket 32. The hooks 119a and 218a of the pillars 11 and 21, respectively, are adapted to be inserted into separate corresponding slots 322a to bring the connecting bracket 32 into contact with the limiting member (i.e., mounting surface 119) of the front pillar 11, or the limiting member (i.e., mounting surface 218) of the rear pillar 21. The limiting members are bent from corresponding fastening surfaces 118 and 217, which helps to increase the rigidity of the pillars 11 and 21. The limiting members (mounting surfaces 119 and 218) fix the side brace member 3 to the pillars 11, 21, and provide resistance to lateral loads applied to the side brace members 3, thereby enhancing the structural stability. This is best illustrated in connection with FIGS. 4A and 4B.

Each connecting bracket 32 also includes a fastening member, such as a secured nut 321a, provided on the fastening surface 321. The fastening surface 321 is also recessed or distanced by a distance W from the end edge 300 of the beam 31 by a distance of 0.5 to 25 mm. Therefore, when a connecting bolt 4 connects the nut 321a and the front pillar 11 through the mounting hole 118a (or connects the nut 321a to the rear pillar 21 through the mounting hole 217a), because the fastening surface 321 is recessed from the end edge 300, the fastening surface 321 is not in direct contact with the fastening surfaces 118 and 217 on the pillars 11 and 21.

Thus, the fastening distance and the fastening force are adaptable. This elastic fastening structure between the fastening surface 321 and the end edge 300, together with frictional contact between the end edge 300 and the fastening surfaces 118 and 217, frictional contact between the mounting surface 322 and the mounting surfaces 119 and 218, and frictional contact between the bolt 4 and fastening surfaces 118 and 217, behaves like an viscoelastic system which offers excellent resistance to impact forces or dynamic loads by absorbing energy. For example, due to this elastic fastening structure, tightening the bolt 4 brings the fastening surface 321 closer to the fastening surface 118 or 217 by slightly deflecting the fastening surfaces 118, 217 inwardly. This results in higher internal tension forces inside the bolt 4, which in return exerts higher contacting forces on the fastening surfaces 118, 217, and the higher contacting forces also results in higher frictional forces between these surfaces. In particular, because the side brace member 3 has a fastening structure on both ends, the side brace member 3 experiences higher compressional forces in the frame structure. These compressional forces reinforce the attachment of the side brace member 3 to the pillars 11 and 21 and make the frame structure substantially rigid. Thus, the structural stability is greatly improved with high resilience to both in-plane (along the fastening direction) and out-of-plane (transverse to the fastening direction) external loads.

The connecting bracket 32 can be formed by bending a plate material, such as metal. The fastening surface 321 is bent inwardly by ninety degrees to form the mounting surface 322, then bent inwardly to form an angled surface 323. This angled surface 323 improves the strength of the connecting bracket 32. This is best illustrated in connection with FIG. 7.

Unlike the conventional flat planar surface to surface contact found in conventional frame structures, the fastening surfaces 118 and 217 on the pillars 11 and 21 are in contact with the end edge 300 of the side brace member, and the fastening surface 321 of the side brace member 3 is recessed from the end edge 300. Therefore, small dents and notches (that are less than the size of the recessed structure) on the ends, or any imperfections on fastening surfaces 118, 217 will not degrade the effectiveness of the fastening. The approach taken by the present invention maximizes tolerance for assembly requirements Referring to FIGS. 1, 2, 18, 19, 20, 21, 22 and 25, one or more cable entry assemblies 24 can be provided in the rear upper frame beam 22 and/or top cover 7. Each cable entry assembly 24 has a mounting bracket 24A and a cable brush structure 24B. The mounting bracket 24A can be formed from bending a plate material, which is provided with a mounting plate 241 having one side bent outwardly by ninety degrees to form a supporting wall 242, and then bent by another ninety degrees to form a transition wall 243. A curved or angled entrapment plate 244 extends from an edge of the transition wall 243. The mounting plate 241 includes one or more mounting openings 241a and one or more fastening tabs 241b that extend parallel with the transition wall 243, and together with the entrapment plate 244 defines a receiving space. The mounting openings 241a allow for installation of the cable entry assembly 24 to the rear upper frame beam 22. The opening 225a of the rear upper frame beam 22 is aligned with the brush part 247 (as described below) of the cable brush structure 24B, and allows cables to pass through the rear upper frame beam 22 and cable entry assembly 24. The coupling edge 246 of the cable brush structure 24B is received into the space between the entrapment plate 244 and the fastening tab(s) 241b, thereby providing a snap-fit installation for the cable brush structure 24B, and easy replacement of the cable brush structure 24B. The cable brush structure 24B also has a brush 247 for allowing cables 248 to extend therethrough.

Figure 21:
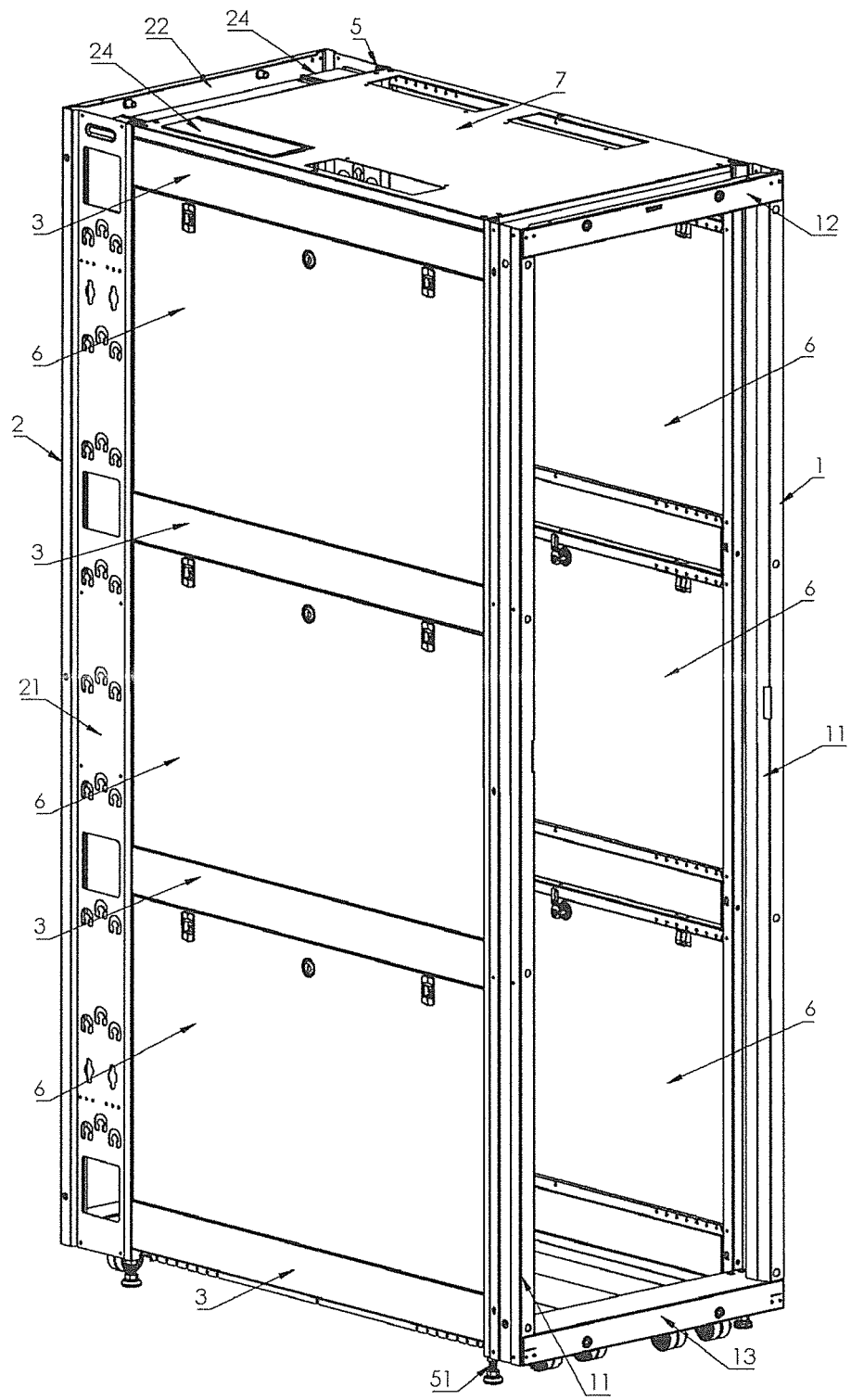
FIG. 21 is a perspective view of the enclosure cabinet according to the present invention showing the side panels installed on to the frame structure of FIG. 1.
Figure 22:
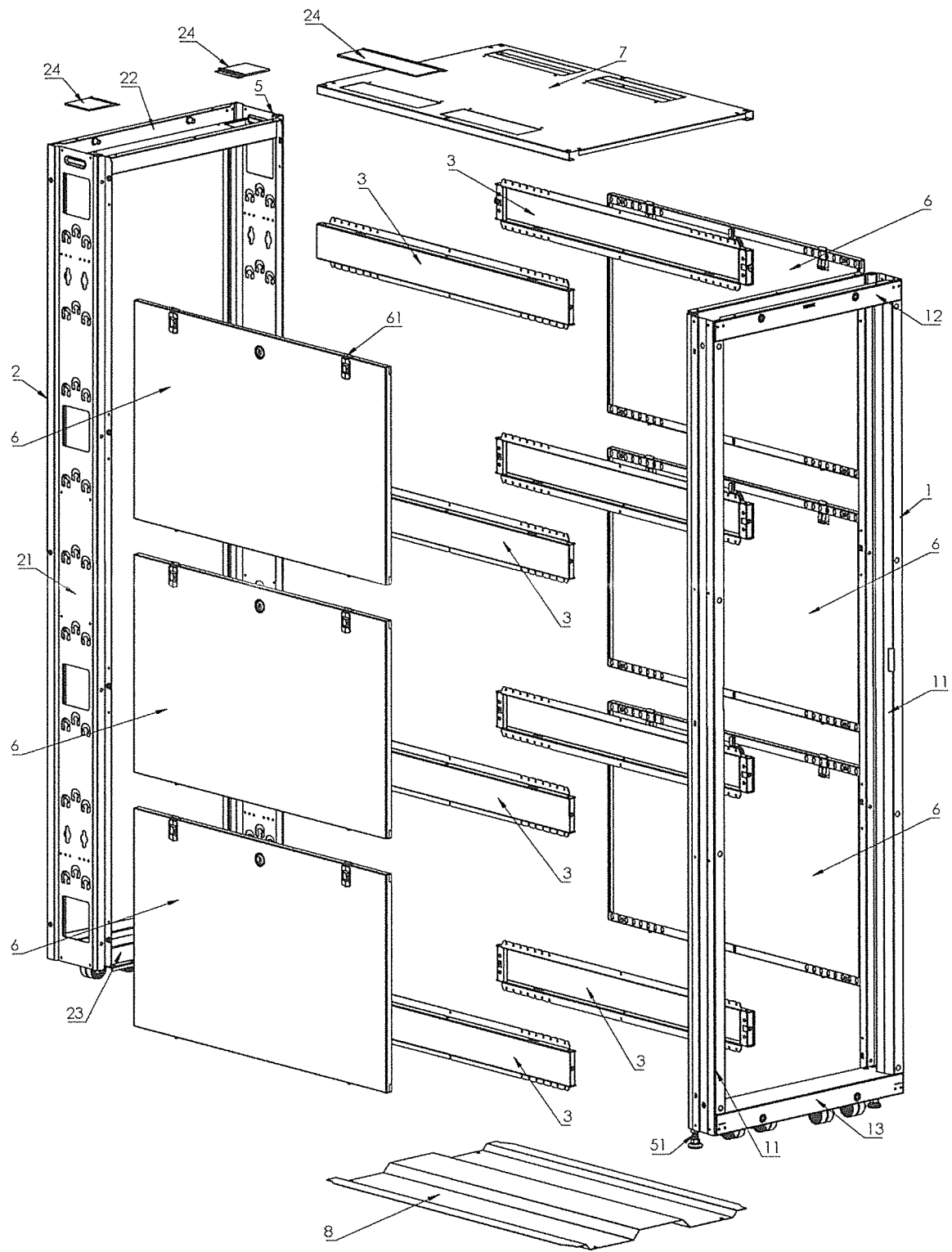
FIG. 22 is an exploded perspective view of the enclosure cabinet of FIG. 21.
Figure 23:
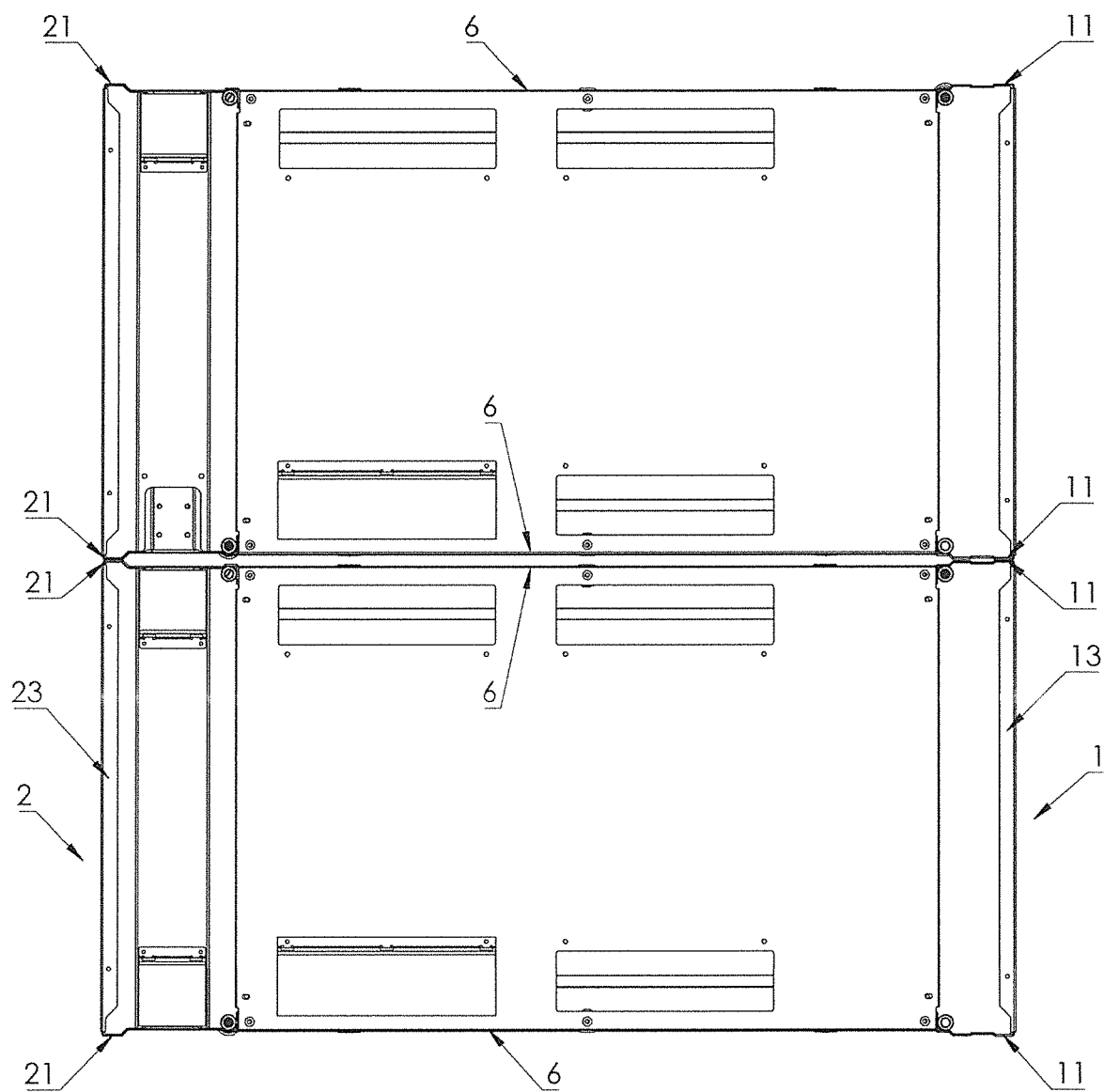
FIG. 23 is a top view of two enclosure cabinets of the present invention shown installed side by side.

Referring now to FIGS. 21, 22 and 24, the side panels 6 can be secured to the recessed flange surfaces 314 and 315 of the beams 31 of the side brace members 3. Specifically, each pair of vertical surface 312/313 and flange surface 314/315 provides a recessed attachment area for connecting edges of each side panel 6 to the beams 31. In addition, each pair of vertical fastening surface 118/217 and mounting surface 119/218 (which functions as limiting member) provides a recessed attachment area for side edges of each side panel 6 to the front pillar 11 or the rear pillar 21. As a result, the outer surfaces of these side panels 6 are also recessed from the outermost surface of the frame assemblies 1 and 2. The flange surface 314/315 and the mounting surface 119/218 can overlap and contact with connecting edges of these side panels 6, and can therefore effectively block airflow through the side of cabinet enclosure. This provides better airflow control which leads to a more energy efficient cooling approach for cabinet enclosures. The upper edge of each side panel 6 can be connected to the lower vertical surface 313 (via slots 313*a*) and the lower flange 315 (via openings 315*a*) of an upper beam 31, and the lower edge of each side panel 6 can be connected to the upper vertical surface 312 (via slots) and the upper flange 314 (via openings 314*a*) of a lower beam 31. Each side panel 6 can have latches 61 that can be inserted through the slots 313*a*.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A frame structure for a cabinet enclosure, comprising:
a front frame assembly having a front pillar, with the front pillar having a front frame fastening surface;
a rear frame assembly having a rear pillar, with the rear pillar having a rear frame fastening surface;
a side brace member having a beam that has a front end edge and a rear end edge, with a connecting bracket provided adjacent each of the front end edge and the rear end edge, the connecting bracket having a brace fastening surface with a fastening member provided on the brace fastening surface;
a first connector that connects the front frame fastening surface to the brace fastening surface adjacent the front end edge;
a second connector that connects the rear frame fastening surface to the brace fastening surface adjacent the rear end edge; and
wherein the brace fastening surface on each connecting bracket is spaced from the front end edge or the rear end edge so that the brace fastening surface for each connecting bracket is spaced from the corresponding front frame fastening surface and rear frame fastening surface.

2. The frame structure of claim 1, wherein:
the front frame assembly also includes a frame mounting surface that is oriented at ninety degrees from the front frame fastening surface, and a retaining member is provided on the frame mounting surface;
each connecting bracket has a bracket mounting surface that is oriented at ninety degrees from the brace fastening surface, and a slot is provided on the bracket mounting surface; and
wherein the retaining member is received inside the slot.

3. The frame structure of claim 1, wherein:
the rear frame assembly also includes a frame mounting surface that is oriented at ninety degrees from the rear frame fastening surface, and a retaining member is provided on the frame mounting surface;
each connecting bracket has a bracket mounting surface that is oriented at ninety degrees from the brace fastening surface, and a slot is provided on the bracket mounting surface; and
wherein the retaining member is received inside the slot.

4. The frame structure of claim 1, wherein each pillar is formed by bending a metal plate to form multiple surfaces, each pillar having at least one recessed surface facing outwardly away from the frame, with each recessed surface having two adjacent raised surfaces.

5. The frame structure of claim 1, wherein the beam of the side brace member comprises a vertical surface and a flange surface extending by ninety degrees from the vertical surface to define a recessed attachment area, the frame structure further including a side panel that is removably connected to the side brace member, with the side panel having a side edge that is received in the recessed attachment area.

6. The frame structure of claim 5, wherein the vertical surface has slots, and the side panel has a latch that is removably inserted into one of the slots.

* * * * *